United States Patent
Lianto et al.

(10) Patent No.: US 10,002,771 B1
(45) Date of Patent: Jun. 19, 2018

(54) METHODS FOR CHEMICAL MECHANICAL POLISHING (CMP) PROCESSING WITH OZONE

(71) Applicant: APPLIED MATERIALS, INC., Santa Clara, CA (US)

(72) Inventors: Prayudi Lianto, Singapore (SG); Kuma Hsiung, Taipei (TW); Eric J. Bergman, Kalispell, MT (US); John L. Klocke, Kalispell, MT (US); Mohamed Rafi, Singapore (SG); Muhammad Azim, Singapore (SG); Guan Huei See, Singapore (SG); Arvind Sundarrajan, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days. days.

(21) Appl. No.: 15/728,604

(22) Filed: Oct. 10, 2017

(51) Int. Cl.
*H01L 21/3105* (2006.01)
*H01L 21/687* (2006.01)

(52) U.S. Cl.
CPC .. *H01L 21/31053* (2013.01); *H01L 21/31058* (2013.01); *H01L 21/68764* (2013.01)

(58) Field of Classification Search
None
See application file for complete search history.

(56) References Cited

U.S. PATENT DOCUMENTS

| | | | |
|---|---|---|---|
| 5,922,620 A | 7/1999 | Shimomura et al. | |
| 6,267,125 B1 | 7/2001 | Bergman et al. | |
| 6,582,525 B2 | 6/2003 | Bergman | |
| 6,601,594 B2 | 8/2003 | Bergman et al. | |
| 7,029,508 B2 | 4/2006 | Scott et al. | |
| 7,842,191 B2 | 11/2010 | Minamihaba et al. | |
| 2001/0007796 A1* | 7/2001 | Hudson | G03F 7/40 438/697 |
| 2004/0219765 A1* | 11/2004 | Reif | H01L 21/6835 438/458 |
| 2005/0236363 A1* | 10/2005 | Bergman | H01L 21/02019 216/57 |
| 2007/0052009 A1* | 3/2007 | Xie | H01L 27/2436 257/318 |

* cited by examiner

*Primary Examiner* — Allan Olsen
(74) *Attorney, Agent, or Firm* — Moser Taboada; Alan Taboada

(57) ABSTRACT

A polymer layer on a substrate may be treated with ozone gas or with deionized water and ozone gas to increase a removal rate of the polymer layer in a chemical mechanical polishing (CMP) process. The ozone gas may be diffused directly into the polymer layer or through a thin layer of deionized water on the surface of the polymer layer and into the polymer layer. The deionized water may also be heated during the process to further enhance the diffusion of the ozone gas into the polymer layer.

20 Claims, 4 Drawing Sheets

METHODS FOR CHEMICAL MECHANICAL POLISHING (CMP) PROCESSING WITH OZONE

FIELD

Embodiments of the present principles generally relate to semiconductor processes.

BACKGROUND

Integrated circuits are typically formed on substrates, particularly silicon wafers, by the sequential deposition of conductive, semiconductive or insulative layers. After each layer is deposited, the layer is etched to create circuitry features. As a series of layers are sequentially deposited and etched, the outer or uppermost surface of the substrate, i.e., the exposed surface of the substrate, becomes increasingly non-planar. However, the non-planar surface presents problems in the photolithographic steps of the integrated circuit fabrication process. Thus, there is a need to periodically planarize the substrate surface.

Chemical mechanical polishing (CMP) is one accepted method of planarization. During planarization, the substrate is mounted on a carrier or polishing head. The exposed surface of the substrate is placed against a rotating polishing pad. The polishing pad may be either a "standard" or a fixed-abrasive pad. A standard polishing pad has a durable roughened surface, whereas a fixed-abrasive pad has abrasive particles held in a containment media. The carrier head provides a controllable load, i.e., pressure, on the substrate to push the substrate against the polishing pad. A polishing slurry, including at least one chemically-reactive agent, and abrasive particles, if a standard pad is used, is supplied to the surface of the polishing pad.

The effectiveness of a CMP process may be measured by the CMP process's polishing rate or removal rate. The removal rate is of particular importance with polymer layers on a substrate because of the polymer's hardness after curing. Planarizing a polymer layer can take an hour or more, greatly slowing the throughput of the semiconductor manufacturing processes. The slow removal rate is one of the main factors as to why polymer layers are not normally planarized, limiting the quality and performance of a semiconductor device due to step-height differences on the surface of the substrate.

Thus, the inventors have provided improved methods of planarization of polymer layers on a substrate.

SUMMARY

In some embodiments, a method of planarizing a semiconductor substrate comprises providing a substrate with a polymer layer and treating at least a portion of the polymer layer on the substrate by diffusing a gas into at least a portion of a thickness of the polymer layer such that a removal rate by a chemical mechanical polishing (CMP) process is at least approximately 150% of a removal rate of an untreated polymer layer. In some embodiments, the method further comprises treating the at least a portion of the polymer layer by exposing the at least a portion of the polymer layer to an ozone gas; exposing the at least a portion of the polymer layer to the ozone gas up to approximately 60 minutes; concentrating the ozone gas up to approximately 300,000 parts per million (ppm); flowing the ozone gas at a rate up to approximately 10 standard liters per minute (slpm); pressurizing the ozone gas up to approximately 100 pounds per square inch (psi); flowing deionized water on the at least a portion of the polymer layer while exposing the at least a portion of the polymer layer to the ozone gas; rotating the substrate on a central axis of the substrate at a rate of approximately 400 rpm to approximately 1500 rpm; heating the deionized water to a temperature of approximately 25 degrees Celsius to approximately 100 degrees Celsius; flowing the deionized water onto the at least a portion of the polymer layer at a flow rate up to approximately 400 milliliters per minute; and/or treating the at least a portion of the polymer layer on the substrate by diffusing the ozone gas into the at least a portion of the thickness of the polymer layer such that a removal rate by a chemical mechanical polishing (CMP) process is at least approximately 600% of a removal rate of an untreated polymer layer.

In some embodiments, a method of planarizing a semiconductor substrate comprises treating a polyimide layer on a substrate which comprises flowing deionized water over a top surface of the polyimide layer; spinning the substrate on a central axis of the substrate to form a boundary layer of deionized water on the top surface of the polyimide layer; flowing ozone gas with a gas concentration of up to approximately 300,000 ppm over a top surface of the boundary layer to diffuse the ozone gas through the boundary layer and into the polyimide layer and removing material from the polyimide layer with a chemical mechanical polishing (CMP) process, wherein a removal rate of a treated polyimide layer is at least approximately 150% of a removal rate of an untreated polyimide layer. In some embodiments, the method further comprises pressurizing the ozone gas up to approximately 100 psi; flowing the ozone gas at a rate up to approximately 10 slpm, spinning the substrate at a rate of approximately 400 revolutions per minute (rpm) to approximately 1500 rpm; heating the deionized water to a temperature of approximately 25 degrees Celsius to approximately 100 degrees Celsius; flowing the deionized water at a flow rate up to approximately 400 milliliters per minute; removing material from the polyimide layer with the CMP process, wherein a removal rate of a treated polyimide layer is at least approximately 600% of a removal rate of an untreated polyimide layer; and/or treating the polyimide layer for up to approximately 60 minutes.

In some embodiments, a method of planarizing a substrate comprises flowing deionized water over a top surface of the polyimide layer at a temperature of approximately 25 degrees Celsius to approximately 100 degrees Celsius, spinning the substrate on a central axis of the substrate at a rate of approximately 400 rpm to approximately 1500 rpm to form a boundary layer of deionized water on the top surface of the polyimide layer and flowing ozone gas with a gas concentration up to approximately 300,000 ppm at a pressure up to approximately 100 psi over a top surface of the boundary layer to diffuse the ozone gas through the boundary layer and into the polyimide layer.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
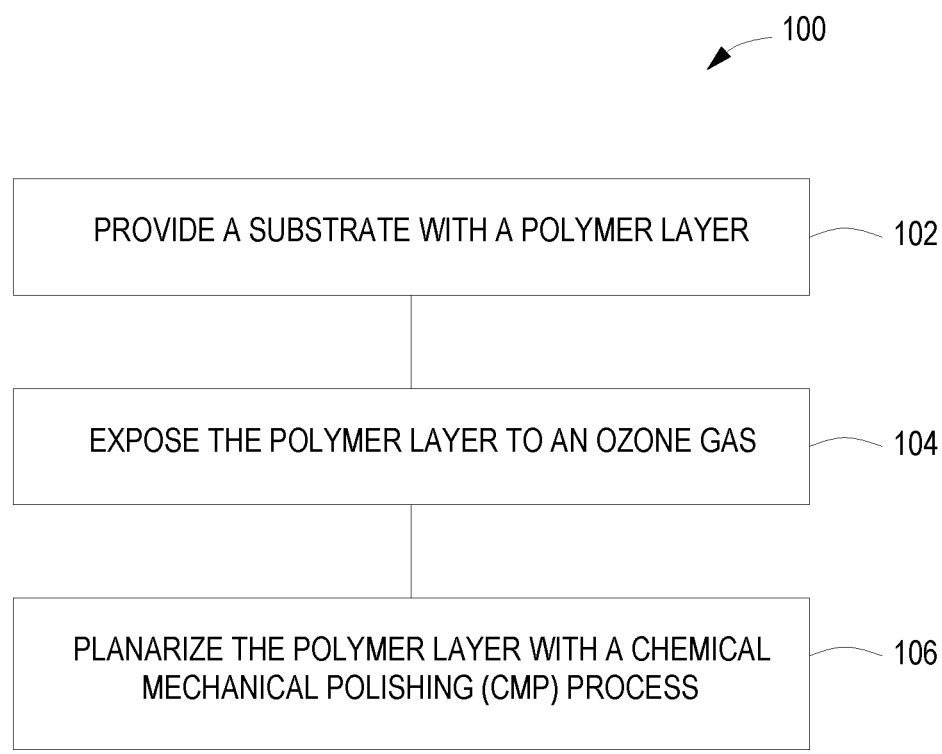
FIG. 1 is a method of processing a polymer layer on a substrate in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Polymer materials can be used on a substrate to produce an electrical isolation layer. Polymer is very popular for use in redistribution layers (RDLs) which are quite common in wafer level packaging such as fan-in/fan-out semiconductor process flows. Because polymer is cured to produce a very hard material, chemical-mechanical polishing (CMP) is generally not used on polymer material due to a very low removal rate. At best, a CMP polymer removal rate is less than 100 nanometers per minute (nm/min) with a state-of-the-art slurry mix. An average slurry mix has a polymer removal rate of 1 nm/min to 50 nm/min. The slow removal rate of polymer makes CMP processing of the polymer impractical due to the amount of time required for planarization. The removal rate greatly limits the use of polymer materials in fine-pitch semiconductor processes which require highly planarized surfaces.

Polymers, especially polyimides, are known in the industry to have a high resistance to oxidation. While researching to find ways to improve polymer removal rates, the inventors were unexpectedly surprised to find that a gas known for having high oxidizing properties, ozone ($O_3$), made a significant improvement in the removal rate of polymer materials. The inventors found that exposing a polymer layer directly to ozone gas caused a diffusion of the ozone gas into the polymer layer. The ozone gas treatment produced an increase in CMP removal rate up to approximately 200% or more. The inventors also found that using a heated deionized water boundary layer on the surface of a polymer layer increased the diffusion of the ozone gas into the polymer layer. The deionized water/ozone gas treatment produced an increase in CMP removal rate up to approximately 600% or more.

The dramatic increase in CMP removal rates for polymer materials was counterintuitive in light of the fact that polyimide is known to be virtually impervious to ozone attack. Since the common use of ozone is for oxidizing surfaces of materials, especially metals, the inventors were not anticipating any benefits to arise from testing ozone on polymer materials. Although ozone is known as one of the strongest oxidizers, ozone has not been accepted by the semiconductor industry because ozone has been found to be ineffective in semiconductor processing. In spite of the industry perceptions, the inventors persevered and discovered that ozone appears to advantageously alter chemical bonds below the surface of a polymer material making the polymer material more susceptible to CMP processing.

Another factor that makes ozone less desirable to use in the semiconductor industry is that to increase a concentration of ozone in water, the water is chilled. At zero degrees Celsius, the soluble ozone concentration is approximately 70ppm. The use of cold water is not conducive to semiconductor processes which generally use heat in the process flows. In addition, the cold water or blue water process (so called due to the blue color of ozone rich water) is typically an immersion process which can make the process incompatible with most semiconductor tools. High temperatures promote reaction rates but also suppress solubility of the ozone in the water. By using an ozone gas that is diffused through a heated deionized water boundary layer on the surface of a polymer material, the inventors discovered that a high concentration of ozone (up to approximately 300,000 ppm) can be achieved while heating a polymer material to promote higher reaction (diffusion) rates into the polymer material.

Figure 2:
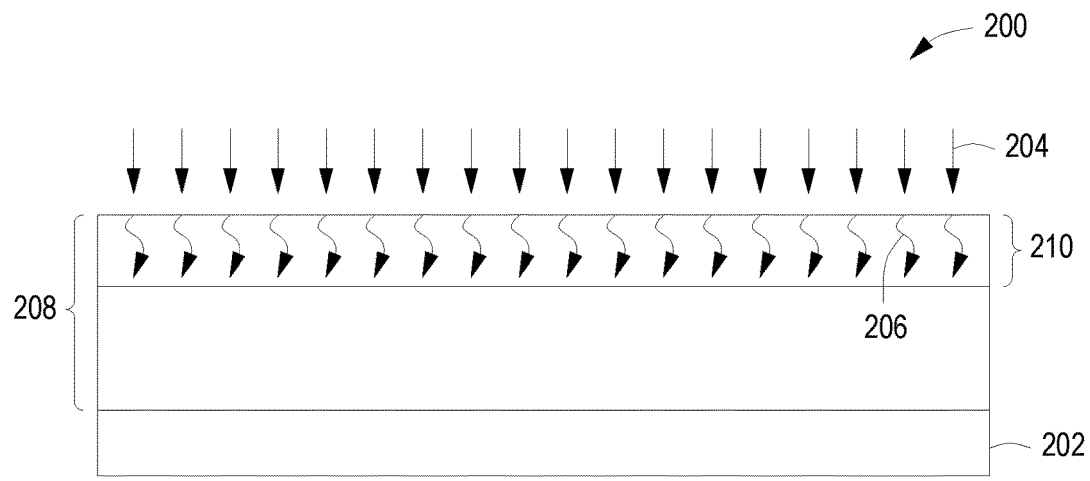
FIG. 2 depicts a cross sectional view of a substrate processed in accordance with some embodiments of the present principles.

FIG. 1 is a method 100 of processing a polymer layer (208 of FIG. 2) on a substrate (202 of FIG. 2) in accordance with some embodiments. FIG. 2 depicts a cross sectional view 200 of the substrate 202 processed in accordance with the method 100 of FIG. 1. The substrate 202 is provided with a polymer layer 208 (flow block 102). The polymer layer 208 can be deposited on the substrate 202 in any manner, such as, for example, spin coating. The polymer layer 208 may include a polyimide material. The polymer layer 208 may be deposited and then subjected to a curing process. The polymer layer 208 is then exposed to an ozone gas 204 (flow block 104). The ozone gas 204 may have a concentration up to approximately 300,000 ppm. The ozone gas 204 flow rate may be up to approximately 10 slpm.

The ozone gas 204 diffuses (illustrated by arrows showing a diffused ozone gas 206) into the polymer layer 208 to create a diffusion region 210. The diffusion region 210 is a portion of the polymer layer 208 that has chemical bonds modified by the ozone gas 204. The modified chemical bonds of the diffusion region 210 allow a subsequent planarization of the polymer layer 208 with a CMP process (flow block 106) to remove material from the polymer layer 208 at a higher rate than portions of the polymer layer 208 not subjected to the diffused ozone gas 206. In some embodiments, an improvement of approximately 1.5 times (150%) or more in CMP removal rate may be achieved after treatment with ozone. In some embodiments, an improvement of 2 times (200%) or more in CMP removal rate may be achieved after treatment with ozone. In some embodiments, treatment with ozone may last up to approximately 60 minutes.

A diffusion rate of ozone gas into a polymer layer may be greater than approximately three nm/min at a pressure of one atmosphere. Increasing the pressure will increase the diffusion rate of ozone gas into a polymer layer. In some embodiments, the pressure may be up to approximately 100 psi. The diffusion rate of the ozone gas into the polymer layer is a gradient with the highest diffusion rate (fastest treatment) occurring near a top surface of a polymer layer. The high diffusion rate near the top surface allows the polymer layer to be treated while undergoing a CMP process.

Figure 3:
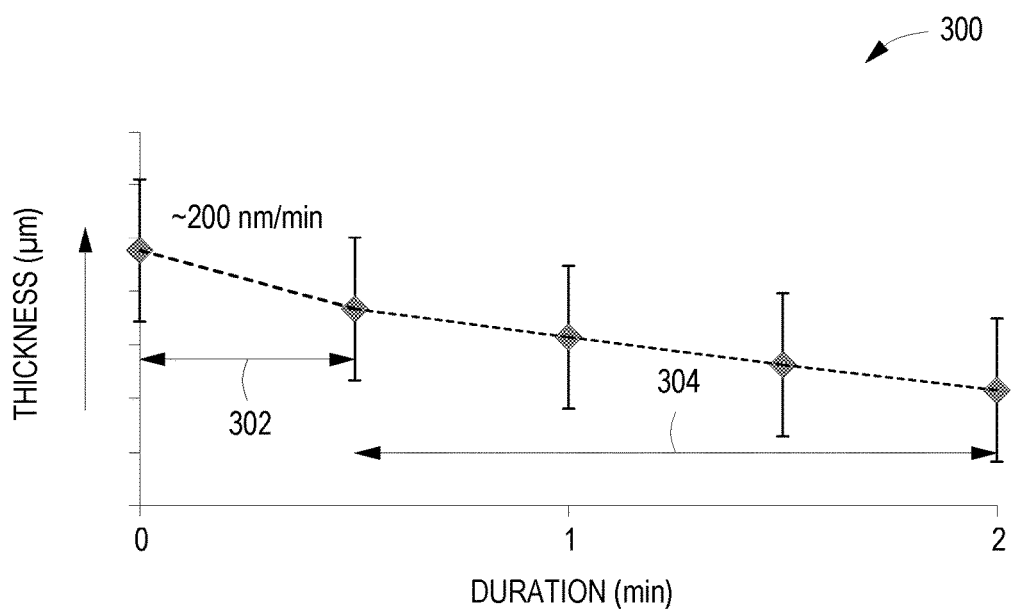
FIG. 3 is a graph illustrating improvements obtained in accordance with some embodiments of the present principles.

FIG. 3 is a graph 300 illustrating improvements obtained in CMP removal rates of polymer material in accordance with some embodiments. Test data shown in the graph 300 depicts the increased removal rate obtained when a polymer layer is exposed to ozone gas and planarized with a CMP process. In the illustrative example of FIG. 3, which is not meant to limit the processes disclosed in any manner, the polymer layer was first exposed to ozone gas with a concentration of approximately 225,000 ppm for approximately 30 minutes. A CMP process was then performed on the polymer layer with a slurry mix having properties of approximately 50 to approximately 100 nm/min removal rate. The inventors discovered that the removal rate increased dramatically to approximately 200 nm/min for approximately the first 30 seconds (302) of the CMP process. In the subsequent time period 304 of the test, the removal rate returned to the removal rate of the slurry mix. The inventors believe that the removal rate slows when the CMP process reaches polymer material that is outside of the diffusion region formed by the ozone gas treatment.

Figure 4:
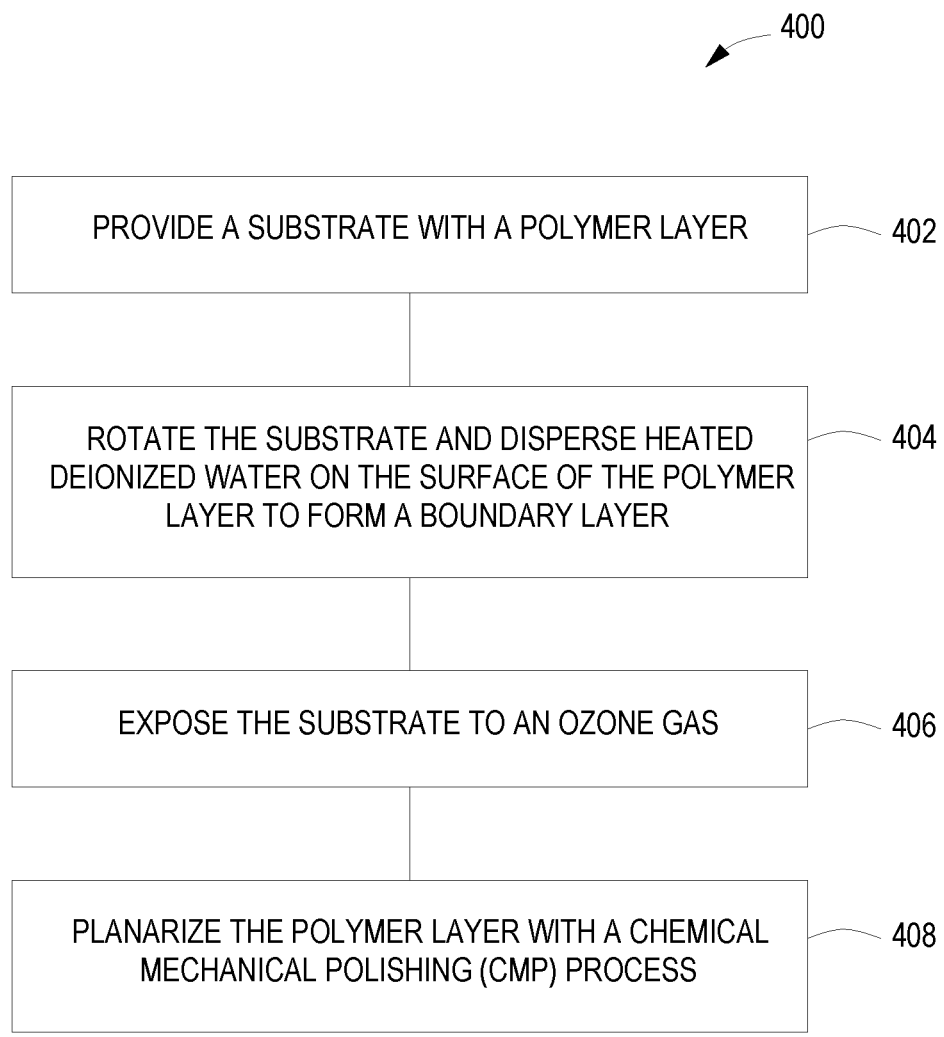
FIG. 4 is another method of processing a polymer layer on a substrate in accordance with some embodiments of the present principles.
Figure 5:
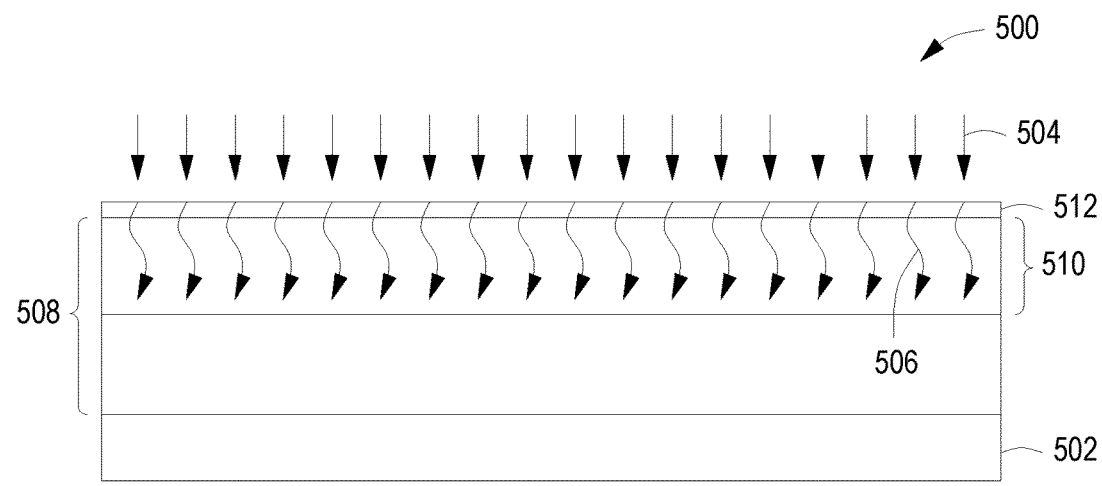
FIG. 5 depicts a cross sectional view of a substrate processed in accordance with some embodiments of the present principles.

FIG. 4 is another method 400 of processing a polymer layer (508 of FIG. 5) on a substrate (502 of FIG. 5) in accordance with some embodiments. FIG. 5 depicts a cross sectional view 500 of the substrate 502 processed in accordance with the method 400 of FIG. 4. The substrate 502 is provided with a polymer layer 508 (flow block 402). The polymer layer 508 can be deposited on the substrate 502 in any manner, such as, for example, spin coating. The polymer layer 508 may include polyimide material. The polymer layer 508 may be deposited and then subjected to a curing process. The substrate 502 is rotated about the substrate's central axis while heated, deionized water is dispersed on the surface of the polymer layer 508 to form a boundary layer 512 of deionized water (flow bock 404). In some embodiments, the substrate 502 may be rotated at approximately 400 rpm to approximately 1500 rpm. In some embodiments, rotational speeds greater than approximately 1500 rpm may be advantageous in reducing a thickness of the boundary layer 512. Increasing rpms substantially higher than 1500 rpm may have detrimental effects including increased particle contamination. In some embodiments, the substrate 502 may be rotated at approximately 1000 rpm. In some embodiments, the substrate 502 may be rotated up to approximately 400 rpm (see below with reference to FIG. 6). In some embodiments, the substrate 502 may be stationary (zero rpms) as the deionized water is flowed over the substrate.

The rotational rate may be adjusted to compensate for the flow rate of the deionized water and other factors so that the boundary layer 512 is thinned to an acceptable thickness associated with a particular ozone diffusion rate into a polymer layer. In some embodiments, a thickness of the boundary layer 512 is from approximately 100 microns to approximately 1000 microns. In some embodiments, a thickness of the boundary layer 512 is from approximately 100 microns to approximately 300 microns. In some embodiments, a boundary layer may be formed on a stationary substrate, resulting in a thicker boundary layer than when rotating the substrate. The ozone will diffuse into the polymer layer at a slower diffusion rate due to the thicker boundary layer. In some embodiments, the deionized water may be dispensed at a temperature of approximately 25 degrees Celsius to approximately 100 degrees Celsius. In some embodiments, the flow rate of the deionized water may be up to approximately 100 ml/min.

The substrate 502 is then exposed to an ozone gas 504 (flow block 406). The ozone gas 504 may have a concentration up to approximately 300,000 ppm. The ozone gas 504 flow rate may be up to approximately 10 slpm. The ozone gas 504 diffuses (illustrated by arrows showing a diffused ozone gas 506) through the boundary layer 512 and into the polymer layer 508 to create a diffusion region 510. The diffusion region 510 is a portion of the polymer layer 508 that has chemical bonds modified by the ozone gas 504. The modified chemical bonds of the diffusion region 510 allow a subsequent planarization of the polymer layer 508 with a CMP process (flow block 408) to remove material from the polymer layer 508 at a higher rate than portions of the polymer layer 508 not subjected to the diffused ozone gas 506. In some embodiments, an improvement of approximately six-fold or more (600% or more) in removal rate may be achieved. In some embodiments, treatment with ozone and deionized water may last up to approximately 60 minutes. A diffusion rate of ozone gas into a polymer layer may be greater than approximately 10 nm/min at a pressure of approximately one atmosphere with deionized water heated to a temperature of approximately 80 degrees Celsius to approximately 100 degrees Celsius. Increasing the pressure will increase the diffusion rate of ozone gas into a polymer layer. In some embodiments, the pressure may be up to approximately 100 psi. The diffusion rate of the ozone gas into the polymer layer is a gradient with the highest diffusion rate (fastest treatment) occurring near a top surface of a polymer layer. The high diffusion rate near the top surface allows the polymer layer to be treated while undergoing a CMP process.

Figure 6:
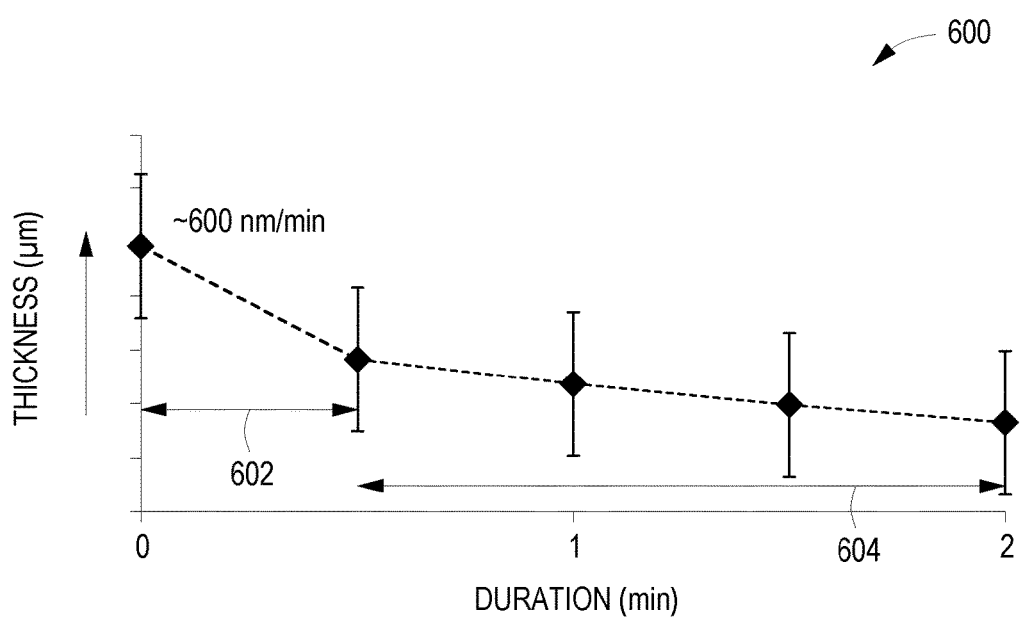
FIG. 6 is a graph illustrating improvements obtained in accordance with some embodiments of the present principles.

FIG. 6 is a graph 600 illustrating improvements obtained in accordance with some embodiments. Test data shown in the graph 600 depicts the increased removal rate obtained when a polymer layer is exposed to ozone gas through heated, deionized water and planarized with a CMP process. In the illustrative example of FIG. 6, which is not meant to limit the processes disclosed in any manner, a deionized water boundary layer was formed on the surface of the polymer layer by spinning the substrate at a rate of approximately 150 rpm. Using slower rpms increases a boundary layer thickness and slows the diffusion rate of the ozone into the polymer layer. The inventors believe that increasing the rpms will significantly reduce the treatment period with equal or better diffusion results (faster rpms yielding a thinner boundary layer and faster diffusion). The methods disclosed provide significant removal rate increases for polymer materials with lower rpms as well. The deionized water was heated to a temperature of approximately 25 degrees Celsius and flowed at a rate of approximately 50 ml/min. The boundary layer formed on the polymer surface was approximately 0.25 mm to approximately 1.0 mm thick. Ozone gas with a concentration of approximately 225,000 ppm was then diffused through the boundary layer and into the polymer layer for approximately 30 minutes.

A CMP process was then performed on the polymer layer with a slurry mix having properties of approximately 50 to approximately 100 nm/min removal rate. The inventors discovered that the removal rate increased dramatically to approximately 600 nm/min for approximately the first 30 seconds (602) of the CMP process. In the subsequent time period 604 of the test, the removal rate returned to the removal rate of the slurry mix. The inventors believe that the removal rate slows when the CMP process reaches polymer material that is outside of the diffusion region formed by the ozone gas and heated deionized water treatment. The removal rate increased over using just ozone gas as a treatment, and the amount of material removed also increased. The inventors believe that diffusing the ozone gas through the heated, deionized boundary layer increases the removal rate and also the depth of the diffusion region, allowing more material to be removed at a faster rate.

The inventors have speculated that the ozone may be affecting carbon-carbon double bonds in the polymer material. The water boundary layer may provide a highly polar molecule to displace the electron cloud in the carbon-carbon double bonds. In carbon-carbon double bonds, the electron cloud is more dislocated and more susceptible to hydrolysis.

While the foregoing is directed to embodiments of the present principles, other and further embodiments of the principles may be devised without departing from the basic scope thereof.

The invention claimed is:

1. A method of planarizing a semiconductor substrate, comprising:
    treating at least a portion of a polymer layer on a substrate by diffusing a gas into at least a portion of a thickness of the polymer layer such that a removal rate by a chemical mechanical polishing (CMP) process is at least approximately 150% of a removal rate of an untreated polymer layer.

2. The method of claim 1, further comprising:
    treating the at least a portion of the polymer layer by exposing the at least a portion of the polymer layer to an ozone gas.

3. The method of claim 2, further comprising:
    exposing the at least a portion of the polymer layer to the ozone gas up to approximately 60 minutes.

4. The method of claim 2, further comprising:
    concentrating the ozone gas up to approximately 300,000 ppm.

5. The method of claim 2, further comprising:
    flowing the ozone gas at a rate up to approximately 10 slpm.

6. The method of claim 2, further comprising:
    pressurizing the ozone gas up to approximately 100 psi.

7. The method of claim 2, further comprising:
    flowing deionized water on the at least a portion of the polymer layer while exposing the at least a portion of the polymer layer to the ozone gas.

8. The method of claim 7, further comprising:
    rotating the substrate on a central axis of the substrate at a rate of approximately 400 rpm to approximately 1500 rpm.

9. The method of claim 7, further comprising:
    heating the deionized water to a temperature of approximately 25 degrees Celsius to approximately 100 degrees Celsius.

10. The method of claim 7, further comprising:
    flowing the deionized water onto the at least a portion of the polymer layer at a flow rate up to approximately 400 milliliters per minute.

11. The method of claim 7, further comprising:
    treating the at least a portion of the polymer layer on the substrate by diffusing the ozone gas into the at least a portion of the thickness of the polymer layer such that a removal rate by a chemical mechanical polishing (CMP) process is at least approximately 600% of a removal rate of an untreated polymer layer.

12. A method of planarizing a semiconductor substrate, comprising:
    treating a polyimide layer on a substrate, comprising:
        flowing deionized water over a top surface of the polyimide layer;
        spinning the substrate on a central axis of the substrate to form a boundary layer of deionized water on the top surface of the polyimide layer;
        flowing ozone gas with a gas concentration up to approximately 300,000 ppm over a top surface of the boundary layer to diffuse the ozone gas through the boundary layer and into the polyimide layer; and
    removing material from the polyimide layer with a chemical mechanical polishing (CMP) process, wherein a removal rate of a treated polyimide layer is at least approximately 150% of a removal rate of an untreated polyimide layer.

13. The method of claim 12, further comprising:
pressurizing the ozone gas up to approximately 100 psi.

14. The method of claim 12, further comprising:
flowing the ozone gas at a rate up to approximately 10 slpm.

15. The method of claim 12, further comprising:
spinning the substrate at a rate of approximately 400 rpm to approximately 1500 rpm.

16. The method of claim 12, further comprising:
heating the deionized water to a temperature of approximately 25 degrees Celsius to approximately 100 degrees Celsius.

17. The method of claim 12, further comprising:
flowing the deionized water at a flow rate of up to approximately 400 milliliters per minute.

18. The method of claim 12, further comprising:
removing material from the polyimide layer with the CMP process, wherein a removal rate of a treated polyimide layer is at least approximately 600% of a removal rate of an untreated polyimide layer.

19. The method of claim 12, further comprising:
treating the polyimide layer for up to approximately 60 minutes.

20. A method of planarizing a substrate, comprising:
    flowing deionized water over a top surface of a polyimide layer at a temperature of approximately 25 degrees Celsius to approximately 100 degrees Celsius;
    spinning the substrate on a central axis of the substrate at a rate of approximately 400 rpm to approximately 1500 rpm to form a boundary layer of deionized water on the top surface of the polyimide layer; and
    flowing ozone gas with a gas concentration up to approximately 300,000 ppm at a pressure up to approximately 100 psi over a top surface of the boundary layer to diffuse the ozone gas through the boundary layer and into the polyimide layer.

* * * * *